(12) United States Patent
So

(10) Patent No.: US 6,913,871 B2
(45) Date of Patent: Jul. 5, 2005

(54) FABRICATING SUB-RESOLUTION STRUCTURES IN PLANAR LIGHTWAVE DEVICES

(75) Inventor: Daniel W. So, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 10/201,724

(22) Filed: Jul. 23, 2002

(65) Prior Publication Data

US 2004/0017989 A1 Jan. 29, 2004

(51) Int. Cl.[7] .......................... G02B 6/13; H01L 21/311
(52) U.S. Cl. .................. 430/322; 430/321; 430/323; 430/324; 430/329; 385/131; 385/14; 438/696; 438/695; 438/700; 359/569
(58) Field of Search ................. 430/321, 322, 430/323, 324, 329; 385/131, 14; 438/696, 695, 700; 359/569

(56) References Cited

U.S. PATENT DOCUMENTS

| | | | |
|---|---|---|---|
| 4,502,914 A | * | 3/1985 | Trumpp et al. ............. 438/424 |
| 4,729,618 A | * | 3/1988 | Yoshida et al. ............... 385/14 |
| 5,088,099 A | | 2/1992 | Chen et al. |
| 5,105,430 A | | 4/1992 | Mundinger et al. |
| 6,052,399 A | | 4/2000 | Sun |
| 6,104,739 A | | 8/2000 | Hong et al. |
| 6,337,871 B1 | | 1/2002 | Choa |

OTHER PUBLICATIONS

Otte Jakob Homan, A GaAs/AIGaAs DBR laser diode with side–coupled Bragg gratings, A Dissertation submitted to the Swiss Federal Institute of Technology, Zurich for the degree of Doctor of Technical Services, 1996, pp. 67–80.

* cited by examiner

*Primary Examiner*—John A. McPherson
*Assistant Examiner*—Daborah Chacko-Davis
(74) *Attorney, Agent, or Firm*—John F. Travis

(57) ABSTRACT

Optical gratings are fabricated on a scale that may be smaller than the resolution of the lithographic system used to generate the grating pattern. Parallel ridges are formed using lithographic techniques. A conformal deposition and anisotropic etch are then used to form sidewalls on the sides of the ridges. After removing the ridges, the remaining sidewalls are used as a mask to etch the substrate. Removing the sidewalls leaves the desired grating pattern, with a pitch spacing of one-half that of the original ridges.

27 Claims, 5 Drawing Sheets

FABRICATING SUB-RESOLUTION STRUCTURES IN PLANAR LIGHTWAVE DEVICES

BACKGROUND

1. Technical Field

An embodiment of the invention pertains generally to the fabrication of surface elements on a substrate, and in particular pertains to the fabrication of surface grating structures using integrated circuit fabrication techniques.

2. Description of the Related Art

Optical gratings with a sub-micron pitch have multiple uses, among them as distributed Bragg reflectors (DBR) in edge-emitting lasers. In edge-emitting lasers, photons of light are generated in a layer of substrate material and emitted from an edge of the substrate. A grating pattern on a surface of the substrate is used to generate successive multiple in-phase reflections of the light that is generated within or guided by the substrate, permitting a particular wavelength of light to be reflected through constructive reinforcement. The grating pattern is implemented with parallel ridges (i.e., parallel lines of material along the surface that are raised above the material between ridges), with each ridge internally reflecting a portion of the light that strikes it. The grating pitch (the center-to-center spacing between adjacent ridges in the grating) determines the wavelength of the emitted laser light, and multiple grating sections with different pitches can be used to reflect multiple wavelengths of light at the same time, such as in the grating structures of a sampled grating, a superstructured grating, a binary grating, etc.

In order to optimize the performance of the optical fiber used in telecommunication, many edge-emitting lasers require a grating with a pitch of about 250 nanometers (nm). Conventional fabrication techniques to produce gratings with this pitch have at least one of these drawbacks: they are 1) too expensive (the cost per grating is too high), 2) too slow (the throughput is inadequate for volume production), 3) poor quality (the grating lines lack the necessary precision for satisfactory laser performance), and 4) cannot produce multi-pitch or circular gratings (needed for tunable semiconductor lasers and/or special-purpose applications).

BRIEF DESCRIPTION OF THE DRAWINGS

The invention may be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known structures and techniques have not been shown in detail in order not to obscure an understanding of this description.

References to "one embodiment", "an embodiment", "example embodiment", "various embodiments", etc., indicate that the embodiment(s) of the invention so described may include a particular feature, element, or characteristic, but not every embodiment necessarily includes the particular feature, element, or characteristic. Further, repeated use of the phrase "in one embodiment" does not necessarily refer to the same embodiment, although it may.

In various embodiments, an optical grating is fabricated that has a pitch that is one-half the line-to-line spacing of the initial pattern created to fabricate the optical grating. In embodiments using lithographic techniques for the initial pattern, gratings with variable pitches, circular gratings, and other non-uniform and/or non-straightline grating patterns may be patterned with a single exposure.

FIGS. 1-A through 1-I show a cross-section of a structure during a fabrication process, according to one embodiment of the invention. As used herein, the term 'structure' refers to the various layers of material that are attached to one another and the physical features that may have been created in those layers. In a particular embodiment, 'structure' includes a wafer and all attached layers and features that are undergoing semiconductor fabrication at the indicated stage in the process. It is understood that FIGS. 1-A through 1-I are not drawn to scale, and no inference should be drawn as to relative physical dimensions based on the relative drawing dimensions shown in FIGS. 1-A through 1-I.

Figure 1A:
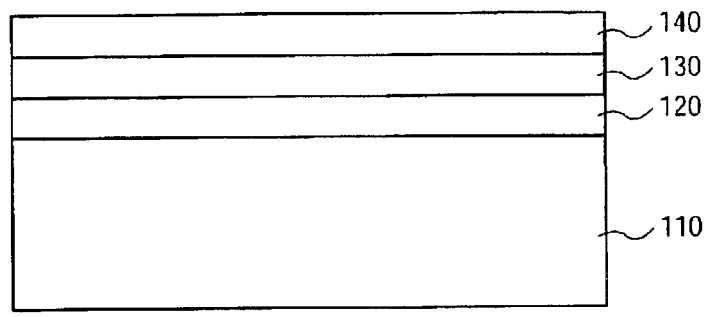
FIGS. 1-A through 1-I show a cross-section of a structure during a fabrication process, according to one embodiment of the invention.
Figure 1B:
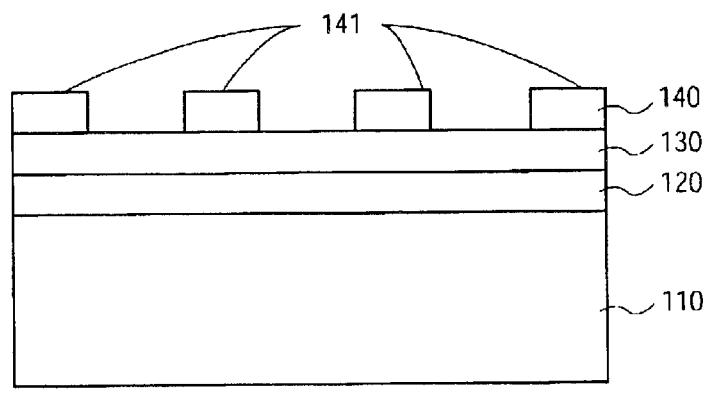
Figure 1C:
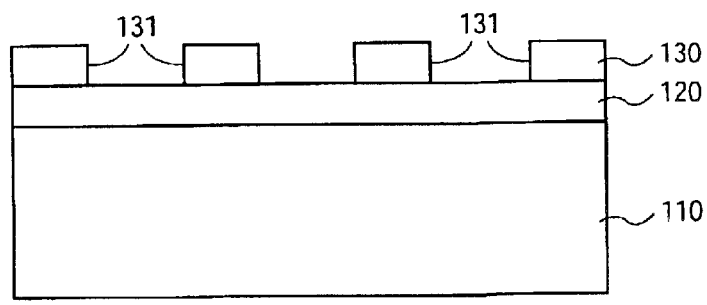
Figure 1D:
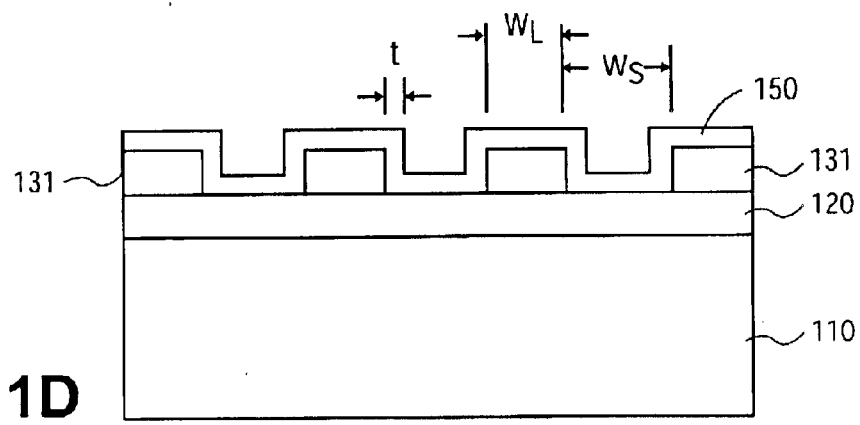
Figure 1E:
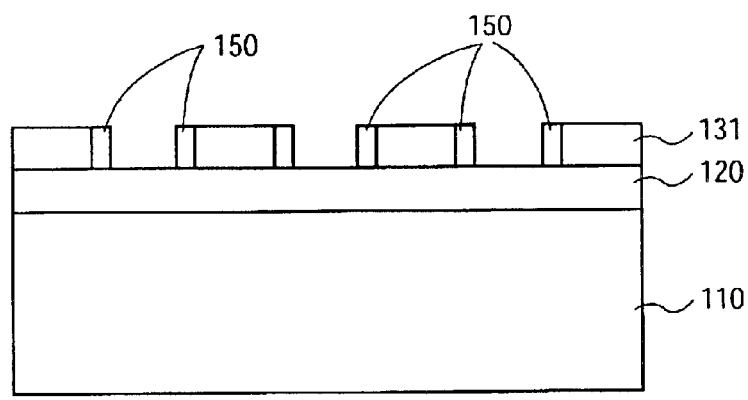
Figure 1F:
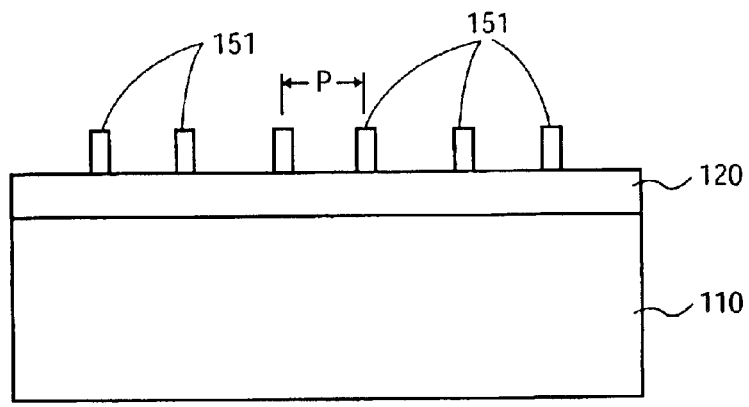
Figure 1G:
Figure 1H:
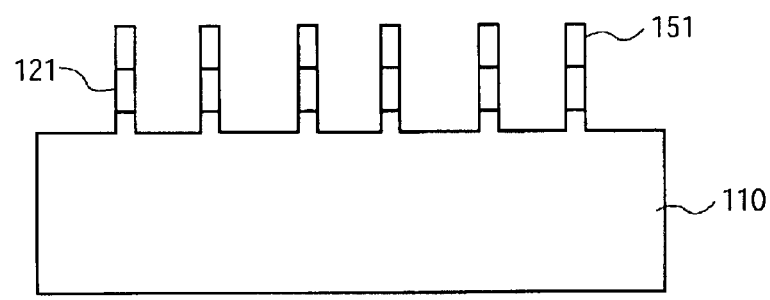
Figure 1I:
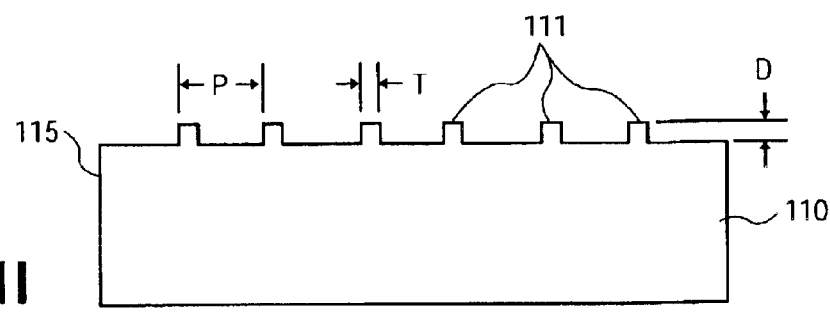
Figure 2:
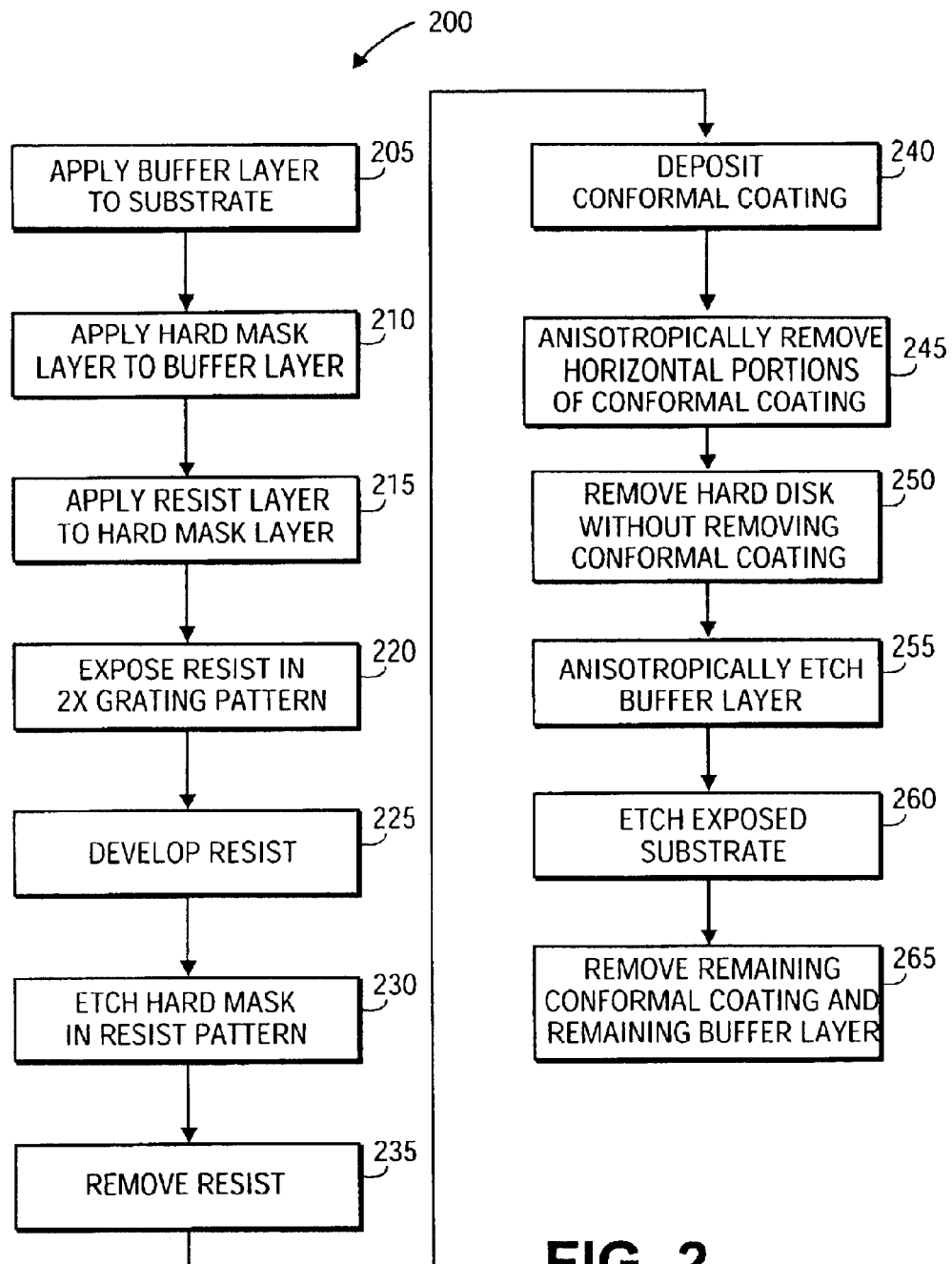
FIG. 2 shows a flow chart of a fabrication process, according to one embodiment of the invention.

FIG. 2 shows a flow chart of a fabrication process, according to one embodiment of the invention. Portions of the following text refer both to FIG. 2 and to FIGS. 1-A through 1-I. However, it is understood that the structure shown in FIGS. 1-A through 1-I and the flow chart 200 of FIG. 2 may be implemented independently of each other.

With reference to FIG. 2, in the illustrated embodiment a structure is prepared by successively applying to a substrate a buffer layer at block 205, a hard mask layer at block 210, and a resist layer (sometimes called a photoresist layer) at block 215. In one embodiment, this produces the structure shown in FIG. 1-A. Although the terms 'resist', 'buffer', 'hard mask', and 'substrate' are used herein, other terms may be used to describe the relevant layers without departing from the scope of various embodiments of the invention. For example, the buffer layer may be labeled as an underlying layer during the fabrication process because it underlies the hard mask layer. The various layers may be applied using known or yet-to-be developed techniques.

Referring to FIG. 1-A, in one embodiment the substrate 110, buffer layer 120, hard mask layer 130, resist layer 140 are the substrate, buffer layer, hard mask layer and resist layer, respectively, of FIG. 2. While in one embodiment substrate 110 comprises indium phosphide (InP), buffer layer 120 comprises silicon dioxide ($SiO_2$), hard mask layer 130 comprises polysilicon, and resist layer 140 comprises an acrylic polymer, other embodiments may use other materials. For example, in some embodiments hardmask layer 130 may comprise nickel (Ni), substrate 110 may comprise other compound semiconductor materials selected from Group III and/or Group V of the well-known Periodic Table of Elements, such as GaAs, InGaAsP or InGaAs, or semiconductor materials from Group IV of the periodic table such as silicon (Si), or doped insulating materials such as Ge-doped silicon dioxide ($SiO_2$), or undoped insulating materials such as $SiO_2$, or electro-optical materials such as lithium niobate ($LiNbO_3$), etc. In one embodiment the resist layer 140 is less than or equal to 0.5 microns in thickness, the hard mask layer 130 is less than or equal to 0.25 microns in thickness, and the buffer layer 120 is less than or equal to 0.25 microns in thickness, but other embodiments may use other thicknesses in any or all of these layers.

Returning to FIG. 2, at block 220 the resist layer is exposed to light in a pattern including parallel adjacent lines, in which the center-to-center spacing between the parallel adjacent lines is twice the pitch desired in the final grating. (In the context of this document, "final grating" refers to the grating produced by the described processes. The final grating may still undergo further processes and/or changes not described herein.) While in one operation the pattern includes straight parallel lines with a constant pitch, in other operations the pattern may include other configurations of parallel lines (e.g., concentric circular lines, parabolic lines, different pitches in different sections of the pattern, etc.). These and other grating patterns may be combined in a single exposure operation at block 220.

While in one embodiment the light pattern may be created by directing light through a transmissive mask that is optically transparent in certain areas and optically opaque in other areas (to the wavelengths of light being used), other embodiments may use other techniques (e.g., the light pattern may be created by directing light off a reflective mask that is optically reflective in certain areas and optically absorbent in other areas). Various embodiments may include an optical system that increases and/or decreases the size of the image pattern that is focused on the resist layer, as compared with the size of the pattern in the mask.

Exposure to light may change the physical and/or chemical characteristics of the resist material, so that exposed and non-exposed areas will respond differently to a subsequent development operation. Various embodiments may use various exposure energies to accomplish this change, depending on the specific characteristics of the resist material. In a particular embodiment, the exposure energy reaching the resist material (e.g., radiation intensity x exposure time) is approximately 105 mJ/cm$^2$, but other embodiments may use other exposure energies.

At block 225, the resist is developed to remove resist material in a pattern corresponding to the exposure pattern. In one type of resist development operation using positive photoresist, areas of resist material that were exposed to light are removed, while the non-exposed areas remain. In an alternate type of resist development operation using negative photoresist, areas of resist material that were exposed to light remain, while the non-exposed areas are removed.

Development of the resist may take various forms in various embodiments, but in a particular embodiment, development includes: 1) immersing the structure in a solution of developer and water, 2) mildly agitating the structure, 3) rinsing the structure in deionized water for about 1 minute, and 4) spinning the structure until dry.

In the illustrated embodiment, FIG. 1-B shows a result after the resist material of FIG. 1-A has been exposed and developed. Resist lines 141 (shown in cross-section) represent the areas of resist material remaining after exposure and development. The center-to-center spacing of resist lines 141 establishes the pitch of the final grating. In one embodiment the pitch of the final grating is equal to one-half the center-to-center spacing of resist lines 141.

Returning to FIG. 2, but with reference to FIGS. 1-B and 1-C, the pattern of resist lines produced in block 225 is imparted into the hard mask layer 130 at block 230 by etching the areas of hard mask layer 130 that are not covered by resist lines 141. As used herein, the term 'etch' refers to any process used to remove a selected material, including but not limited to one or more of: chemical reaction, particle bombardment, plasma reaction, etc. While in one embodiment chlorine ($Cl_2$) is used to etch the hard mask layer 130, other embodiments may use other techniques and/or other chemicals.

Once the exposed areas of hard mask layer 130 have been etched, leaving protected areas of the hard mask layer 130 under the resist lines intact, the resist lines themselves are removed at block 235. Removal of the remaining resist material may take various forms in various embodiments, but in one embodiment the resist material is removed by submersing the structure in a liquid chemical that dissolves the resist material (e.g., at least one of ether, hexane, etc.), agitating, draining the liquid chemical, and spinning the structure dry. Other embodiments may use other known or yet-to-be developed processes and/or chemicals.

In the illustrated embodiment, FIG. 1-C shows a result after the exposed hard mask material has been etched and the resist material has been removed. At this point, the original pattern created in the resist material has been transferred into the hard mask layer 130 in the form of ridges 131.

Returning to FIG. 2, at block 240 a conformal coating is applied to the structure. While in one embodiment, the conformal coating is a silicon nitride compound (e.g., $Si_xN_y$), other embodiments may use other materials for the conformal coating.

In the illustrated embodiment, FIG. 1-D shows a result after conformal coating 150 has been applied. In the illustrated embodiment the conformal coating coats substantially all of the exposed surfaces in the area of application, including both the horizontal surfaces (e.g., the tops of ridges 131 and the exposed areas of buffer layer 120) and the vertical surfaces (e.g., the sides of ridges 131). (Note: As used herein, the terms "horizontal" and "vertical" refer to the orientation shown in the figures. The physical orientation in an actual operation may be different.) The portion of conformal coating on the sides of ridges 131 may be referred to as sidewalls.

In one embodiment the conformal coating coats both horizontal and vertical surfaces to a substantially uniform thickness, but in other embodiments the horizontal portions of conformal coating 150 may have a different thickness than the vertical portions. In one embodiment the horizontal portions of conformal coating 150 are less than or equal to 0.25 microns and the vertical portions of conformal coating 150 are approximately one-half that thickness, but other thicknesses may be used on either or both of the horizontal and vertical portions of conformal coating 150. The thickness t of the vertical portions, i.e., the thickness t of the sidewalls, may have a greater effect on the final grating than the thickness of the horizontal portions, as the sidewalls establish the width of the final grating ridges, while the horizontal portions are removed during fabrication. Other dimensions shown in FIG. 1-D may also affect the final grating. $W_L$ is the width of ridges 131, while $W_S$ is the spacing between ridges 131. For reasons that are shown in the subsequent figures, a uniform pitch in the grating is obtained if $W_L+t$ equals $W_S-t$, resulting in a final pitch of $(W_L+W_S)/2$. Of course, perfect uniformity may not be achievable in an actual device. Process variations may cause non-uniformity within a certain tolerance. The permissible tolerance may be defined by the performance requirements of the final device.

Returning to FIG. 2, the horizontal portions of conformal coating 150 are removed at block 245 (e.g., through an anisotropic etch process). While in one embodiment the etch is performed using a mixture of $CHF_3$ and $O_2$, other embodiments may use other types of etch processes that are suitable for the materials involved (e.g., an $SF_6$/He etch, etc.). In the illustrate embodiment, FIG. 1-E shows a result after portions of conformal coating 150 have been anisotropically removed. As can be seen, the anisotropic process removes the horizontal portions of conformal coating 150 from both the tops of ridges 131 and from the areas of buffer layer 120 between ridges 131, while leaving the sidewalls of conformal coating 150 relatively intact. At this point the tops of ridges 131 are exposed for further processing.

Returning to FIG. 2, the ridges 131 of hard mask layer 130 are removed at block 250, while leaving the sidewalls of conformal coating substantially intact. While in one embodiment ridges 131 are removed by exposing the structure to a chlorine gas, other embodiments may use other processes to remove ridges 131 without removing the remaining conformal coating 150.

In the illustrated embodiment, FIG. 1-F shows a result after the material of hard mask layer 130 has been removed. The result includes ridges 151, which are now free-standing sidewalls comprised of conformal coating 150. The center-to-center spacing of ridges 151 is labeled p in the figure. In an embodiment in which the dimensions of $W_L$, $W_S$, and t are sufficiently controlled, p is substantially uniform from one ridge to the next. The spacing p between ridges 151 is substantially one-half the center-to-center spacing of the original resist lines 141 that were formed in FIG. 1-B. The foregoing operations may therefore be used to create a repeating structure with twice the resolution as the resolution needed in the original repeating pattern of block 220 in FIG. 2 and/or FIG. 1-B.

At block 255, an etch process (e.g., an anisotropic etch process) is used to transfer the pattern represented the sidewalls into the buffer layer by using the sidewalls as a mask to selectively etch the material of the buffer layer that is not under the sidewalls. While in one embodiment a mixture of chlorine and argon is used to perform the etch, other embodiments may use other techniques and/or chemicals.

In the illustrated embodiment, FIG. 1-G shows a result after the buffer layer 120 has been etched. In the illustrated embodiment the pattern represented by ridges 151 has been transferred into buffer layer 120 in the form of ridges 121, leaving a two-tier stack of ridges.

Returning to FIG. 2, at block 260 the surface material of the substrate is removed in those areas not covered by the buffer layer ridges, using an etch process (e.g., an anisotropic etch process). The depth of the removed layer may be carefully controlled, as this affects the height of the final grating ridges. Unlike some other more conventional processes for fabricating optical gratings on a sub-micron scale, the substrate is protected by layers of other material until this stage, thus protecting the substrate from surface damage during all but the final operations.

In the illustrated embodiment, FIG. 1-H shows a result of the substrate removal operation, in which ridges are formed on the top surface of the substrate 110, matching the pattern of ridges 121.

Returning to FIG. 2, at block 265 the remaining material of the conformal coating and the buffer layer may both be removed to leave a pattern of ridges along the surface of the substrate. While in one embodiment the removal is accomplished by exposing the structure to carbon tetrafluoride ($CF_4$), other embodiments may use other techniques and/or chemicals. While in one embodiment the buffer layer ridges and the hard mask ridges are both removed in a single operation, in another embodiment the hard mask ridges may be removed in one operation, and the buffer layer ridges removed in a separate operation. In a particular embodiment the hard mask ridges may be removed before etching the substrate and the buffer layer ridges may be removed after etching the substrate.

In the illustrated embodiment, FIG. 1-I shows the final grating that results after ridges 121 and 151 have been removed. The relevant dimensions of the grating are shown as P (the grating pitch, which is equal top of FIG. 1-F), D (the height of the ridges 111), and T (the thickness of the ridges 111). Allowable dimensions for these parameters may be established by the optical requirements of the grating, which in turn may be established by performance parameters of the optical device (e.g., an edge-emitting laser device). Although T is initially established by the thickness t of the sidewalls in conformal coating 150 in FIG. 1-D, subsequent processes may affect whether the dimension t is accurately transferred to the dimension T. These effects may be considered when establishing the necessary thickness t that will produce the required thickness T. Although the illustrated embodiment shows ridges 111 to be substantially rectangular in cross-section, with planar horizontal tops and planar vertical sides, other embodiments may vary (e.g., the tops may be rounded, the sides may be slanted and/or curved, etc.).

When completely fabricated, in one embodiment the substrate has a surface with a grating structure that determines the wavelength(s) of light emitted from an edge of the substrate, but alternate embodiments may use the grating structure for other purposes. When operational, in one embodiment the material of substrate 110 internally generates photons of light when an electric voltage is applied to the substrate 110, while in other embodiments light may be introduced into the substrate 110 through other techniques (e.g., from an external source).

Although various embodiments have been described with respect to a specific series of fabrication operations, other embodiments may contain more or fewer fabrication operations. For example, in one embodiment the operations of blocks 245 and 250 may be performed with chemicals and/or processes that are not harmful to the material of substrate 110, so that buffer layer 120 and its associated processes may be eliminated. Other embodiments may add/subtract other fabrication operations to/from those described. In a particular embodiment, portions of the aforementioned process are used once to produce a first set of ridges with a pitch of one-half the original pattern spacing, and then used again starting with the first set of ridges to produce a second set of ridges with a pitch of one fourth the original pattern spacing. This repetitive process may continue further to produce even smaller pitches, as the control and accuracy of the various fabrication techniques permit.

In an edge-emitting laser device, substrate 110 may be only one of multiple layers stacked together in the final product. Other components may be fabricated directly above and below substrate 110 as apart of the final laser device. In one operation, substrate 110 may be fabricated on top of previously fabricated components that are disposed below substrate 110. In another operation, which may be combined with the first operation, additional components may be fabricated on top of substrate 110 after fabrication of the grating. Both operations may use similar or different types of processes as those previously described.

Figure 3:
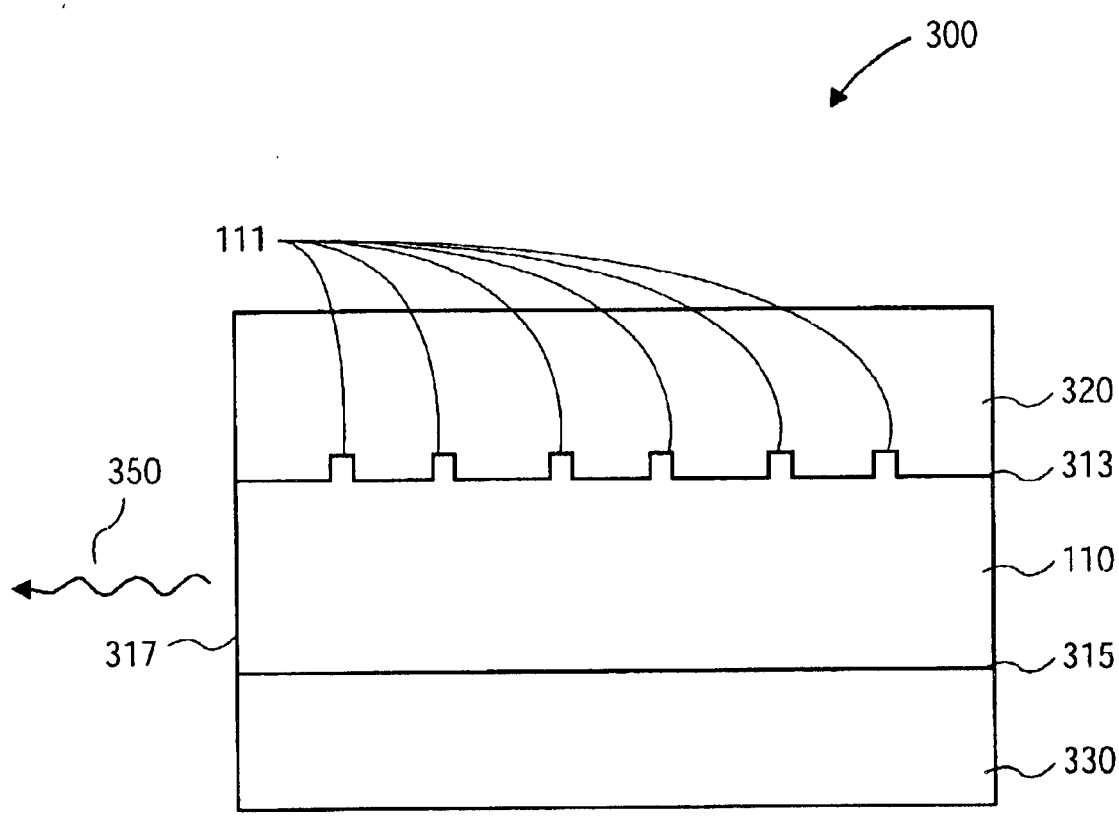
FIG. 3 shows certain layers of an edge emitting laser device, according to one embodiment of the invention.

FIG. 3 shows a cross section of certain layers of an edge emitting laser device, according to one embodiment of the invention. It is understood that the edge emitting laser device of FIG. 3 is not drawn to scale, and no inference should be drawn as to relative physical dimensions based on the relative drawing dimensions shown in FIG. 3. In the illustrated embodiment, the edge emitting laser device 300 includes substrate 110 (corresponding to substrate 110 of FIG. 1-I) to act as an active layer in the edge emitting laser device 300, guide layer 320, and buffer layer 330. Guide layer 320 is disposed in intimate contact with surface 313 of active layer 110, and buffer layer 330 is disposed in intimate contact with surface 315 of active layer 110. The terms "substrate", "guide", and "buffer" are used herein to distinguish between the various layers, but other terms may be used without departing from the scope of various embodiments of the invention.

In one embodiment, substrate 110 is a layer of semiconductor material that generates photons of light when an electrical voltage is applied across substrate 110. In one embodiment, guide layer 320 is a layer of semiconductor material that differs optically from the semiconductor material of substrate 110 (e.g., by having a different index of refraction or by having a reflective surface), such that light within substrate 110 that strikes the interface between substrate 110 and guide layer 320 at surface 313 will be substantially reflected back into substrate 110. In one embodiment guide layer 320 comprises a compound containing elements from Group III and/or Group V of the well-known Periodic Table of Elements. In a particular embodiment, guide layer 320 is comprised of at least one of GaAs, GaN, Si, Ge-doped $SiO_2$, $LiNbO_3$, etc.). In an alternate embodiment, surface 313 is at least partially coated with a reflective material, so that internal reflection is achieved with the reflective coating rather than with different indices of refraction.

Ridges 111, formed in the manner previously described, may be spaced at predetermined intervals to act as in-phase reflectors, causing light of a particular frequency to be constructively reinforced as multiple reflections from multiple ridges add to each other. In one embodiment ridges 111 comprise a distributed Bragg reflector, but other embodiments may use ridges 111 in other ways. When the light reaches edge 317 of substrate 110, a portion of the light 350 may then exit from edge 317, while the remaining light is reflected within substrate 110 for additional constructive reinforcement.

In one embodiment, buffer layer 330 is a layer of semiconductor material that differs optically from the semiconductor material of substrate 110 by having a different index of refraction, such that light within substrate 110 that strikes the interface between substrate 110 and buffer layer 330 at surface 315 will be substantially reflected back into substrate 110. While in one embodiment buffer layer 330 comprises InGaAsP, other embodiments may have a buffer layer comprised of other materials (e.g., Si). In an alternate embodiment, surface 315 is at least partially coated with a reflective material, so that internal reflection is achieved with the reflective material rather than with different indices of refraction.

While in one embodiment surface 315 is flat (as depicted in FIG. 3), in other embodiments surface 315 may have other configurations (e.g., it may contain ridges similar to ridges 111, for additional constructive reinforcement).

The foregoing description is intended to be illustrative and not limiting. Variations will occur to those of skill in the art. Those variations are intended to be included in various embodiments of the invention, which are limited only by the spirit and scope of the appended claims.

What is claimed is:

1. A method, comprising:
producing parallel ridges from a first layer of material, with an underlying second layer of material exposed between the parallel ridges;
depositing a conformal coating on exposed surfaces of the parallel ridges and the second layer of material;
removing portions of the conformal coating to leave sidewalls of the conformal coating on sides of the parallel ridges;
removing remaining portions of the first layer of material between the sidewalls;
etching a substrate using the sidewalls as a mask; and
removing the sidewalls to produce an optical grating in the substrate with a pattern substantially matching the sidewalls;
wherein said producing and said depositing are controlled such that a width of each of the ridges plus a thickness of the sidewalls is approximately equal to a spacing between ridges minus the thickness of the sidewalls.

2. The method of claim 1, wherein:
said producing includes etching the first layer of material to produce the parallel ridges from the first layer of material.

3. The method of claim 1, wherein: said producing includes
depositing on the substrate in succession the second layer of material, the first layer of material, and a layer of resist material;
exposing arid developing the layer of resist material into a pattern; and
etching the first layer of material, using the pattern of resist material as a mask to produce the parallel ridges.

4. The method of claim 3, wherein:
said depositing the second layer of material includes depositing a layer of silicon dioxide.

5. The method of claim 1, wherein:
said depositing the conformal coating includes depositing a coating of silicon nitride.

6. The method of claim 1, wherein:
said producing parallel ridges tom the first layer of material includes producing parallel ridges of polysilicon.

7. The method of claim 1, wherein:
said etching a substrate includes etching indium phosphide.

8. An article, comprising:
an optical grating having grating ridges, the grating ridges fabricated by
producing parallel ridges of a hard mask material, with an underlying layer of material exposed between the parallel ridges;
depositing a conformal coating on exposed surfaces of the parallel ridges and the underlying layer;
removing portions of the conformal coating to leave sidewalls of the conformal coating on sides of the parallel ridges;
removing the hard mask material between the sidewalls;
etching a substrate using the sidewalls as a first mask; and
removing the sidewalls to produce a grating in the substrate with a pattern substantially matching the sidewalls;

wherein said producing and said depositing are such that a width of each of the ridges plus a thickness of the sidewalls is approximately equal to a spacing between ridges minus the thickness of the sidewalks.

9. The article of claim 8, wherein:

said producing includes etching said hard mask material to produce the parallel ridges of the hard mask material.

10. The article of claim 8, wherein said producing includes;

depositing a resist material on the hard mask material;

exposing and developing the resist material into a pattern; and etching said hard mask material using the patterned resist material as a second mask to create the parallel ridges.

11. The article of claim 8, wherein:

said underlying layer is the substrate.

12. The article of claim 8, wherein:

said underlying layer is disposed above the substrate; and said etching the substrate includes etching the underlying layer using the sidewalls as the first mask and subsequently etching the substrate using remaining portions of the underlying layer as a second mask.

13. The article of claim 8, wherein:

the hard mask material includes polysilicon.

14. The article of claim 8, wherein:

the substrate includes indium phosphide.

15. The article of claim 8, wherein:

the underlying layer of material includes silicon dioxide.

16. The article of claim 8, wherein:

the conformal coating includes silicon nitride.

17. A method, comprising:

producing parallel ridges of a hard mask material, with an underlying material exposed between the parallel ridges;

depositing a conformal coating on exposed surfaces of the parallel ridges and the underlying material;

removing portions of the conformal coating to leave sidewalls of the conformal coating on sides of the parallel ridges;

removing the hard mask material between the sidewalls;

etching the underlying material to produce a pattern in the underlying material using the sidewalls as a first mask;

removing the sidewalls; and etching a substrate beneath the underlying material, using the patterned underlying material as a grating mask, to produce an optical grating in the substrate;

wherein said producing and said depositing are performed such that a width of each of the ridges plus a thickness of the sidewalls is approximately equal to a spacing between ridges minus the thickness of the sidewalls.

18. The method of claim 17, further comprising:

applying a guide layer on the optical grating.

19. The method of claim 18, wherein:

the guide layer includes at least one of GaAs, GaN, Si, $SiO_2$, Ge-doped $SiO_2$, and $LiNbO_3$.

20. The method of claim 19, wherein:

the guide layer has a different index of refraction than the substrate.

21. The method of claim 18, wherein:

the guide layer includes a compound containing at least one element from a Periodic Table of Elements.

22. The method of claim 17, wherein:

said producing includes etching the hard mask material to produce the parallel ridges of the hard mask material.

23. The method of claim 17, wherein said producing includes:

depositing a resist material on the hard mask material;

exposing and developing the resist material into a predetermined pattern; and etching the hard mask material using the predetermined pattern of resist material as a second mask to create the parallel ridges.

24. The method of claim 17, wherein:

the hard mask material includes polysilicon.

25. The method of claim 17, wherein:

the underlying layer includes silicon dioxide.

26. The method of claim 17, wherein:

the substrate includes indium phosphide.

27. The method of claim 17, wherein:

the conformal coating includes silicon nitride.

* * * * *

UNITED STATES PATENT AND TRADEMARK OFFICE
CERTIFICATE OF CORRECTION

PATENT NO. : 6,913,871 B2
DATED : July 5, 2005
INVENTOR(S) : So

It is certified that error appears in the above-identified patent and that said Letters Patent is hereby corrected as shown below:

<u>Column 8,</u>
Line 32, delete "arid" and insert -- and --.
Line 44, delete "tom" and insert -- from --.

Signed and Sealed this

Sixth Day of September, 2005

JON W. DUDAS
*Director of the United States Patent and Trademark Office*